United States Patent [19]

Jensen

[11] Patent Number: 4,731,587
[45] Date of Patent: Mar. 15, 1988

[54] ENHANCED QUADRATURE NOTCH FILTER

[75] Inventor: Preben B. Jensen, Rancho Palos Verdes, Calif.

[73] Assignee: Hughes Aircraft Company, Los Angeles, Calif.

[21] Appl. No.: 807,391

[22] Filed: Dec. 10, 1985

[51] Int. Cl.$^4$ .......................... H03B 1/00; H03K 5/00
[52] U.S. Cl. .................................. 328/167; 307/512; 328/139; 333/176
[58] Field of Search .............................. 328/165–167, 328/139; 307/512; 333/175, 176, 178, 173

[56] References Cited

U.S. PATENT DOCUMENTS

| | | | |
|---|---|---|---|
| 3,202,990 | 8/1965 | Howells . | |
| 3,353,147 | 11/1967 | Meeker, Jr. | 367/67 |
| 3,355,668 | 11/1967 | Boensel et al. | 328/167 |
| 3,633,117 | 1/1972 | Reilly, Jr. | 328/166 |
| 3,659,212 | 4/1972 | Saliga | 328/167 |
| 3,912,916 | 10/1975 | Grün et al. | 235/152 |

OTHER PUBLICATIONS

"Adaptive Arrays-An Introduction", by William F. Gabriel, Proceedings of the IEEE, vol. 64, No. 2, Feb. 1976.

*Primary Examiner*—Stanley D. Miller
*Assistant Examiner*—Richard Roseen
*Attorney, Agent, or Firm*—Ronald L. Taylor; A. W. Karambelas

[57] ABSTRACT

An enhanced quadrature notch filter which is capable of rejecting an undesired signal component of an input signal, generally comprising a quadrature phase splitter for producing first and second reference signals which have substantially the same frequency as the undesired signal component but which are 90° out of phase with each other, a pair of amplitude control loops for adding the first and second reference signals to the input signal in amplitudes which will cancel the undesired signal component, and a phase locked loop circuit for maintaining a predetermined phase relationship between the undesired signal component and one of the first and second reference signals.

12 Claims, 10 Drawing Figures

FIG. 1.

Prior Art

ENHANCED QUADRATURE NOTCH FILTER

TECHNICAL FIELD

The present invention generally relates to notch filters for rejecting an undesired signal, and particularly relates to a quadrature notch filter which is enhanced to provide a predetermined phase relationship between the desired signal and the two quadrature reference signals used to cancel the undesired signal.

BACKGROUND OF THE INVENTION

There are many applications where it is necessary to cancel or reject an undesired signal component of an input signal. One such application relates to the processing of a radar return signal. In this application, the radar return signal will be accompanied by an unwanted signal, such as a backscatter signal component, which typically has a significantly larger amplitude than the radar return signal. The frequency excursion of the backscatter signal is usually predictable. Accordingly, a notch filter which is designed for this particular backscatter frequency band provides a convenient way of rejecting the backscatter signal component during the processing of the radar return signal.

One type of notch filter which has been used to reject an undesired signal component has been referred to as a quadrature notch filter. A quadrature notch filter works by adding two amplitude and phase controlled reference signals to the incoming or radar return signal in such a way as to cancel the unwanted signal component. However, this type of notch filter has generally been limited to relatively narrow band width applications (e.g., below 1 MHz). This limitation rises because 4-quadrant multipliers must be used in the filter, and the response of these devices is non-linear during swings between positive and negative phase transistions. This limitation has made it difficult to use quadrature notch filters in relatively wide band width applications, such as the rejection of jamming signals in radar systems and infrared or laser sensors. In such applications, the phase of the backscatter signal can shift quite rapidly even though the frequency band width of the backscatter signal is quite limited. Thus, it would be desirable to provide an enhanced quadrature notch filter circuit which can adapt to relatively high frequency phase shift rates of an undesired or backscatter signal component.

SUMMARY OF THE INVENTION

The present invention provides for an enhanced quadrature notch filter which is capable of rejecting an undesired signal component of an input signal having an unknown phase. The quadrature notch filter according to the present invention generally comprises a quadrature phase splitter for producing first and second reference signals which have substantially the same frequency as the undesired signal component but which are 90° out of phase with each other, a pair of amplitude control loops for adding the first and second reference signals to the input signal in amplitudes which will cancel the undesired signal component, and a phase locked loop circuit for maintaining a predetermined phase relationship between the undesired signal component and one of the first and second reference signals. The phase lock loop circuit will lock onto and track the phase of the undesired or backscatter signal, such that the phase of the two reference signals will be tied to the changing phase of the backscatter signal. This will prevent instantaneous phase reversals in the amplitude control loops, and thereby enable the enhanced quadrature notch filter to be used in high band width applications. Additionally, this will also permit the use of two quadrant multipliers to be used in the filter rather than four quadrant multipliers. A further advantage of the present invention is that a separate source of the reference signals is not necessary.

Additional advantages and features of the present invention will become apparent from a reading of the detailed description of the preferred embodiments which makes reference to the following set of drawings in which:

BRIEF DESCRIPTION OF THE DRAWINGS

FIG. 6 is an overall circuit block diagram for the embodiment of the present invention as shown in FIG. 5.

FIG. 8 is a circuit diagram of the voltage controlled oscillator module shown in FIG. 6.

FIG. 9 is a circuit diagram of the phase locked loop module shown in FIG. 6.

DETAILED DESCRIPTION OF THE PRIOR ART

Figure 1:
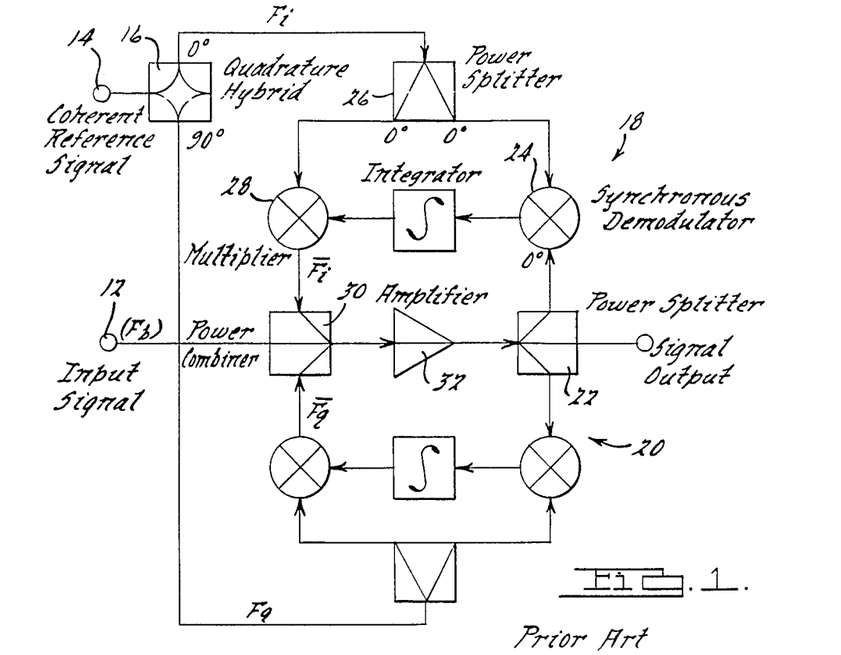
FIG. 1 is a block diagram of quadrature notch filter.

Referring to FIG. 1, a block diagram of a quadrature notch filter 10 is shown. The input signal containing the undesired signal component $F_b$ enters the circuit at node 12. A coherent reference signal input must also be provided to the quadrature notch filter 10 at node 14. The coherent reference signal will have the same or substantially the same frequency as the signal to be rejected $F_b$. A quadrature hybrid circuit 16 splits the coherent reference signal into two reference signals, namely $F_i$ and $F_q$. The reference signals $F_i$ and $F_q$ will be exactly 90° out of phase with each other (i.e., a quadrature phase relationship). The reference signals $F_i$ and $F_q$ are then transmitted to separate amplitude control loops which are generally designated by the reference numerals 18 and 20 respectively. The purpose of these two control loops is to add the negative amplitude values of the reference signals $F_i$ and $F_q$ in the proportions necessary to create a combined amplitude vector which is 180° opposed in phase to the $F_b$ vector and has the same amplitude as the $F_b$ vector in order to cancel this unwanted or undesired signal component. This phase relationship is shown in the phase diagram of FIG. 2.

The amplitude control loops 18 and 20 are shown to be identical in FIG. 1. Accordingly, only one of the amplitude control loops will be described herein. The amplitude control loop 18 includes a power splitter 22 which transmits a small portion of the output signal from the quadrature notch filter 10 to a synchronous demodulator 24. The synchronous demodulator 24 also includes an $F_i$ input which is transmitted from the quadrature hybrid 16 through a power splitter 26. The synchronous demodulator 24, which can, for example, be a multiplier, will produce a zero output when the relative phase between its two inputs is either plus 90° or minus 90°, and if the amplitude of one of these inputs is zero.

The output of the synchronous demodulator 24 is applied to an integrator 27 which is in turn connected to a multiplier 28. The output from the multiplier 28 has the same phase as the $F_i$ signal. However, the amplitude of the $F_i$ signal output from the multiplier 28 is controlled by the integrator 26. The amplitude control loop 18 is then closed by summing the negative $F_i$ reference signal with the input signal via a power combiner 30. An amplifier 32 may also be used to amplify the summation of the negative $F_i$ and $F_q$ reference signals with the input signal before transmission to the power splitter 22. The phasing of the components in the loop 18 is such that the loop is nulled out at either plus 90° or minus 90° relative to the undesired vector $F_b$. Since the companion loop 20 is always operating at a 90° degree phase shift relative to the amplitude control loop 18, the amplitude control loop 20 is positioned in phase to null out any component left by the amplitude control loop 18.

Figure 2:
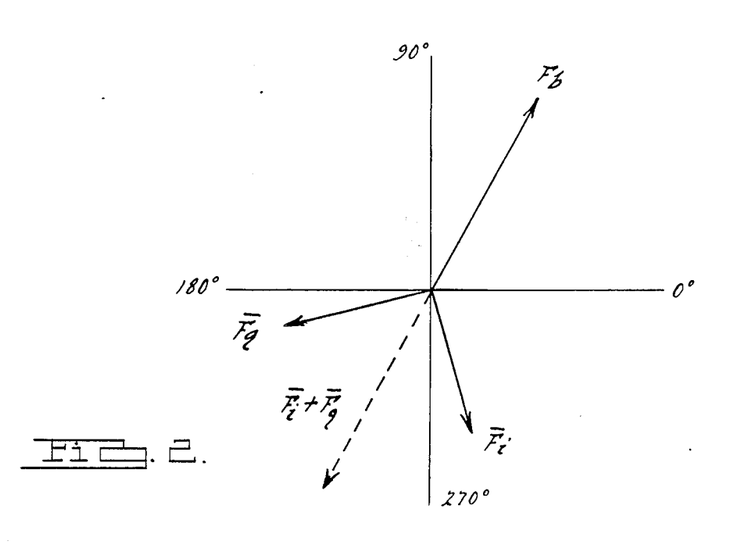
FIG. 2 is a phase diagram illustrating the cancellation of an undesired signal component by the quadrature notch filter shown in FIG. 1.

The shortcoming with respect to the quadrature notch filter 10 is illustrated by examining the case where the phase of $F_b$ is approaching and passing the same phase as $F_i$. As can be seen in FIG. 2, the relative phase of the resultant sum-vector will make an instantaneous 180° phase jump as $F_b$ and $F_i$ cross the same phase. This instantaneous phase reversal has to be performed by one of the multipliers 28, and this requirement has limited this type of quadrature notch filter to low band width operations.

DETAILED DESCRIPTION OF THE PREFERRED EMBODIMENTS

Figure 3:
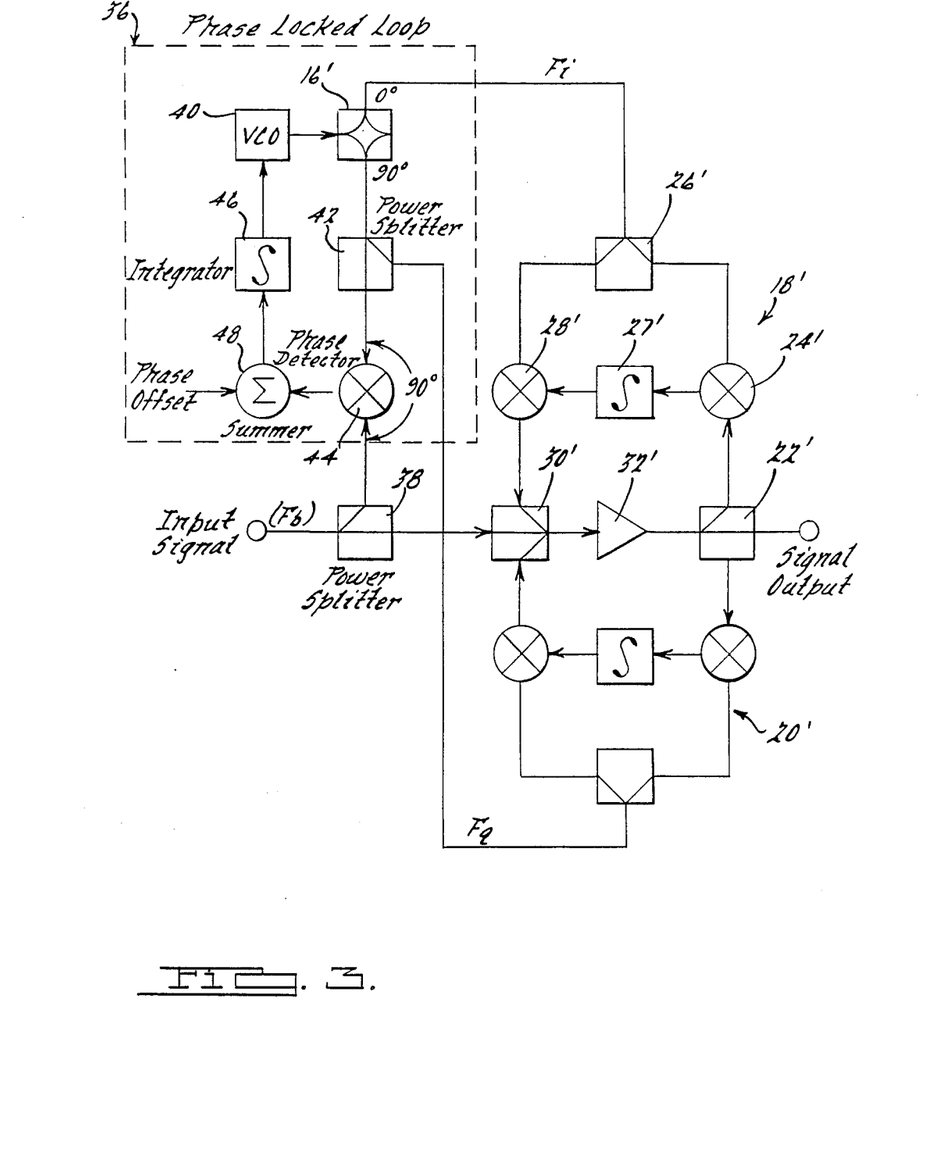
FIG. 3 is a block diagram of an enhanced quadrature notch filter according to the present invention.

Referring to FIG. 3, an enhanced quadrature notch filter 34 according to the present invention is shown. In particular, the filter 34 includes a phase lock loop circuit 36 which is used for maintaining a predetermined phase relationship between the undesired signal component $F_b$ and one of the reference signals $F_i$–$F_q$. Specifically, the phase lock loop circuit 36 will maintain the relative phase between $F_b$ and $F_q$ within a single phase quadrant, and thereby eliminate the requirement for 4-quadrant multiplication by the multipliers 28.

The phase lock loop circuit 36 employs a power splitter 38 to divert a fraction of the energy from the input signal to the phase lock loop control circuit. Generally speaking, the amplitude level of the undesired signal $F_b$ should be at least 20 dB higher than the desired signal (e.g., radar return signal) in order for the phase locked loop circuit 36 to lock onto and track the $F_b$. Accordingly, the phase lock loop circuit 36 acts as a narrow band filter which will lock onto the strong signal and reject the weaker signal.

The phase lock loop circuit 36 also includes a voltage controlled oscillator 40 which is used to generate the signal from which the two reference signal $F_i$ and $F_q$ are derived. Accordingly, it should be noted that the need for a separate reference signal source for the notch filter 10 of FIG. 1 is eliminated in the notch filter design according to the present invention. The output of the voltage controlled oscillator 40 is connected to the quadrature hybrid 16'. It should be noted that common circuit components to FIGS. 1 and 3 are primed for illustration purposes in FIG. 3. The $F_q$ reference signal output from the quadrature hybrid 16' is transmitted to a power splitter 42. The power splitter 42 directs a portion of the $F_q$ reference signal energy to the amplitude control loop 20' and the remaining portion of the energy to a phase detector 44. The phase detector 44 is used to compare the phase shifted $F_q$ reference signal frequency from the voltage controlled oscillator 40 to the incoming signal $F_b$. If these two signals are 90° out of phase, the output of the phase detector 44 will be zero. Otherwise, the phase detector 44 will generate a feedback signal which will be related to the difference between the phases of the $F_b$ and $F_q$ signals. The positive or negative feedback signal from the phase detector 44 is transmitted to an integrator 46 which will steer the voltage controlled oscillator 40 towards a frequency and phase relationship whereby the phase detector 44 will generate a zero feedback signal.

It should also be noted that the phase lock loop circuit 36 includes a summer 48 which will produce a small DC offset to the feedback signal from the phase detector 44. This will change the null point of the phase locked loop 36 from a 90° phase difference between the $F_q$ and $F_b$ signals to 90° plus or minus a few degrees. The addition of this error into the phase locked loop 36 is to avoid a null point at 90° between the reference signal $F_q$ and the undesired signal component $F_b$. Such a 90° null point is undesirable because it will force one of the multipliers 28' to operate around a zero magnitude multiplication factor.

It should be noted that while the phase locked loop circuit 36 ties the phase of $F_b$ to $F_q$, the circuit could also have tied the phase of $F_i$ instead. Additionally, while it is possible in some applications to only use one reference signal to cancel the unwanted signal component $F_b$, two reference signals are preferred due to the difficulty in generating a vector which is exactly 180° out of phase from $F_b$ with just one reference signal.

Figure 4:
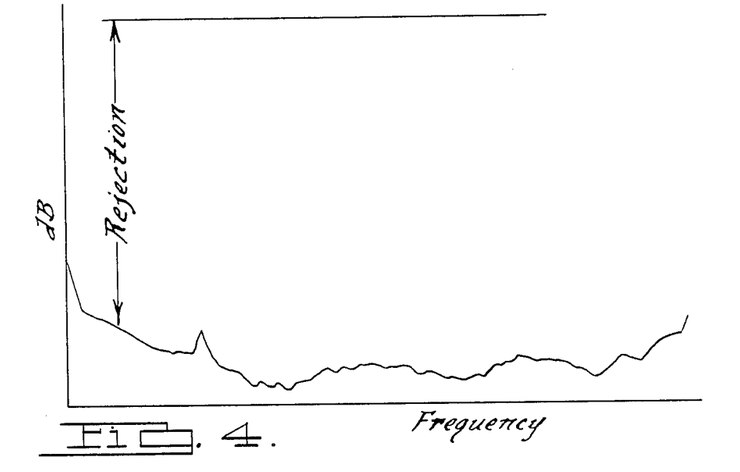
FIG. 4 is a graph showing the performance of an enhanced notch filter according to the present invention.

FIG. 4 is a graphical illustration from a network-analyzer display of the input/output signal magnitudes in dB for the enhanced quadrature notch filter 34. FIG. 4 indicates that rejections between 30 and 60 dB are possible with the enhanced quadrature notch filter 34.

Figure 5:
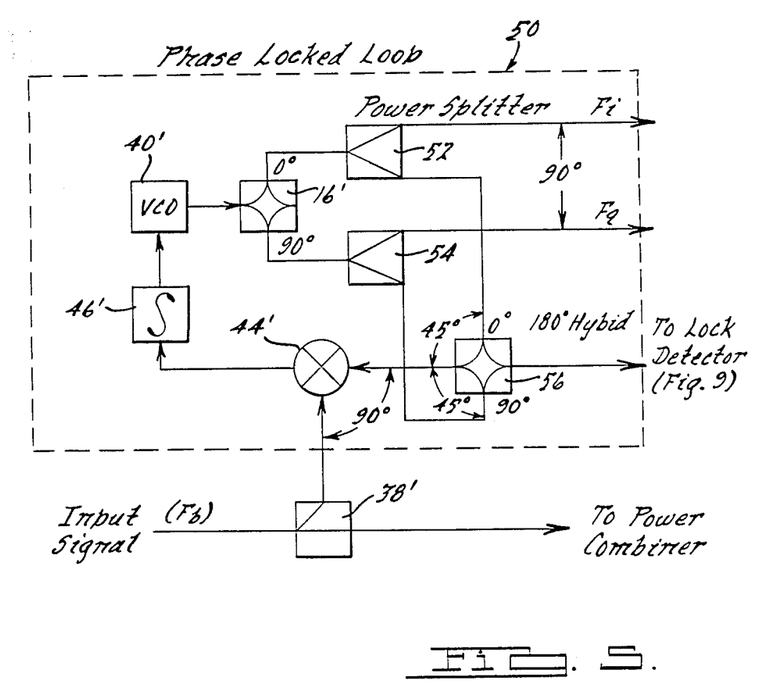
FIG. 5 is a block diagram of another embodiment of a phase lock loop circuit for an enhanced quadrature notch filter according to the present invention.

Referring to FIG. 5, an alternate embodiment of a phase locked loop circuit 50 according to the present invention is shown. The phase locked loop circuit 50 may be employed in the place of the phase locked loop circuit 36 in the enhanced quadrature notch filter 34 shown in FIG. 3. Since the phase locked loop circuit 50 is generally similar to the phase locked loop circuit 36, common reference numerals are shown to be primed in FIG. 5.

The principle feature of the phase locked loop circuit 50 is that it maintains a 45° phase difference between the $F_b$ signal component and each of the reference signals $F_i$ and $F_q$. This 45° angle is ideal for the quadrature rejection circuit, as it provides the maximum phase margin for the multipliers 28'. To achieve this 45° phase relationship, the phase locked loop circuit 50 includes a pair of power splitters 52 and 54, and a hybrid junction 56. The power splitter 52 is connected to the $F_i$ reference signal output of the quadrature hybrid 16', while the power splitter 54 is connected to the $F_q$ reference signal output of the quadrature hybrid. These power splitters 52 and 54 provide a way of transmitting a portion of the energy from the $F_i$ and $F_q$ reference signals to the hybrid junction 56.

The hybrid junction 56 operates to add the $F_i$ and $F_q$ signals together and produce an output signal which is the true vector phase addition of these two signals. Accordingly, since the hybrid junction 56 is adding a zero degree phase signal with a 90° phase signal, it will produce an output signal with a phase vector at 45° and an amplitude which is the square root of the amplitudes of these two reference input signals squared. The output of the hybrid junction 56 is connected to the phase detector 44. This will cause the phase detector 44' to have a null point which is 45° between the phases for the $F_i$ and $F_q$ reference signals. The hybrid junction 56 also produces an output signal on conductor 58 which is 90° phase shifted from the output transmitted to the phase detector 44. This additional output signal is utilized in a lock detector or indicator circuit to be described in connection with FIG. 9.

Referring to FIG. 6, a circuit block diagram of an enhanced quadrature notch filter 60 according to the present invention is shown. The filter 60 is based upon the phase locked loop circuit 50 shown in FIG. 5. However, the block diagram of the filter 60 shown in FIG. 6 is divided into various modules which correspond to certain circuit sections to be described below. For example, the voltage controlled oscillator module 62 and the phase locked loop module 64 shown in FIG. 6 generally comprise the phase locked loop circuit 50 shown in FIG. 5. Similarly, the quadrature rejector module 66 shown in FIG. 6 generally comprises the quadrature notch filter 10 shown in FIGS. 1 and 3. Additionally, the switch module 68 includes among other circuits the power splitter 38' shown in FIG. 5. A intensity demodulator module 70 is also shown in FIG. 6. However, this additional module does not form part of the present invention. Its purpose is to provide blanking, filtering and mode selection.

Figure 7:
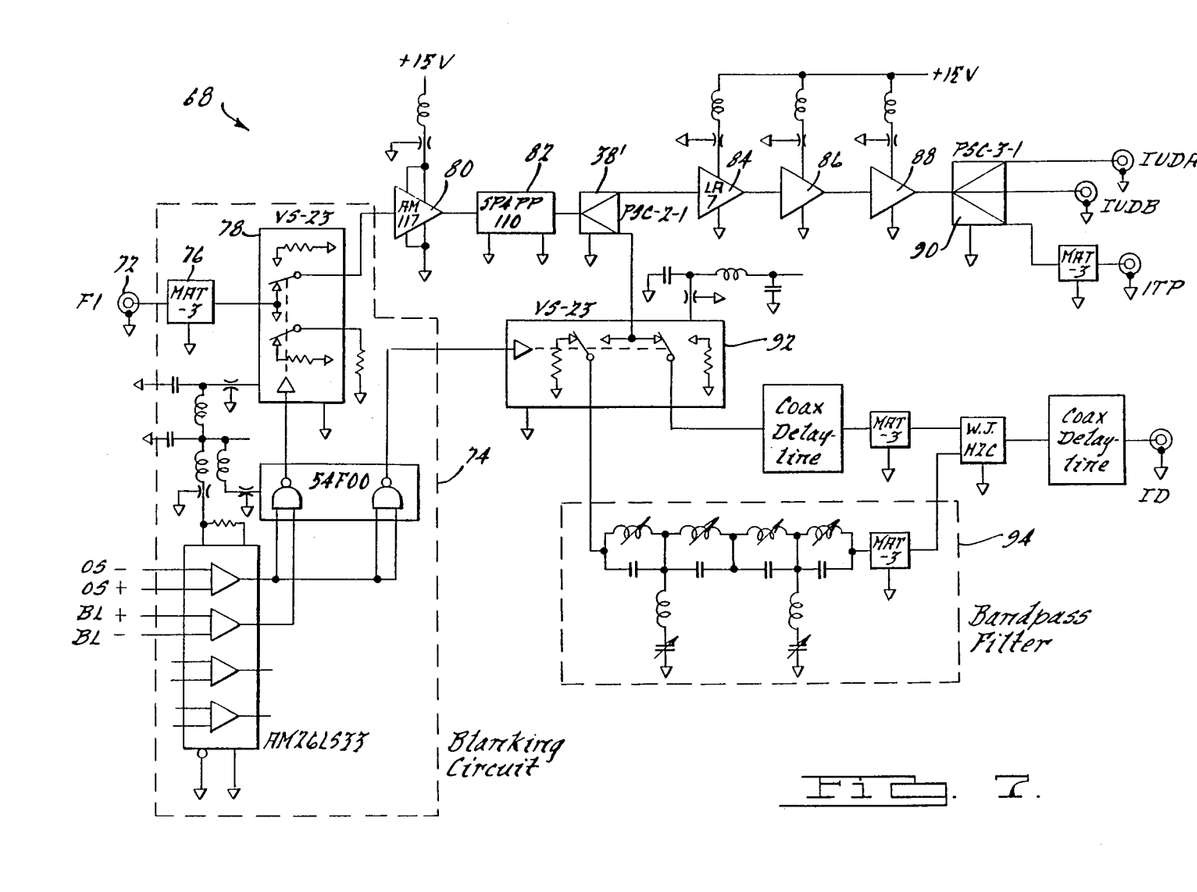
FIG. 7 is a circuit diagram of the switch module shown in FIG. 6.

Referring to FIG. 7, a schematic diagram of the switch module 68 is shown. The input signal containing the undesired signal component $F_b$ is labeled "FI" and node 72. The input signal FI is first transmitted through a blanking circuit 74. The blanking circuit 74 is an optional circuit which could be used to disable the transmission of the FI input signal, such as during certain portions of a modulation cycle when a radar return signal will not be present. The blanking circuit 74 includes an attenuator 76 which acts to reduce the effect of standing waves by providing a three dB attenuation. The blanking circuit 74 also includes a high speed RF switch 78 which responds to the differential blanking input signal "BL".

When the blanking circuit 74 is disabled, the FI input signal will be transmitted through an 8 dB amplifier 80 and a 85-115 MHz band pass filter 82. The input signal FI is then divided into two transmission paths by the power splitter 38'. The first transmission path results in a signal "IUDA" which is directed to the phase detector 44' in the phase locked loop module 64. The other transmission path results in a "ID" signal which is directed to the power combiner 30' in the quadrature rejector module 66.

The first transmission path from the power splitter 38' includes three 15 dB amplifier limiters 84-88, and a three way power splitter 90. The power splitter 90 provides the IUDA output signal identified above, an IUDB output signal to be transmitted to the lock indicator circuit shown in FIG. 9, and a test point signal. The second transmission path from the power splitter 38' includes a high speed RF switch 92 which is used to direct the FI input signal through an optional band pass filter circuit 94. In this particular embodiment, the band pass filter circuit 94 is used to remove the edges of the frequency band width of interest (85-115 MHz). The switch 92 operates in response to the "OS" differential command signal shown at the left of FIG. 7.

Referring to FIG. 8, a circuit diagram of the voltage controlled oscillator module 62 is shown. The voltage controlled oscillator modulator 62 includes the voltage controlled oscillator circuit 40'. The voltage controlled oscillator circuit 40' generally comprises a pair of FET transistors 96-98 (part number 2N4416), and their associated resistors and capacitors. In this embodiment, the voltage controlled oscillator circuit 40' is provided with two inputs. One of these inputs is the "FC" frequency control signal from the integrator circuit 46' shown in FIG. 9. The other input is from the optional frequency steering circuit 100. The frequency steering circuit 100 is used to provide gross tuning for the voltage controlled oscillator circuit 40', while the frequency control signal FC is used to provide fine tuning for the oscillator circuit 40'.

The frequency steering circuit 100 operates in response to an "OSV" differential balanced input signal which can be deprived from any suitable source, such as a laser modulator. The OSV input signal is used to steer the voltage controlled oscillator circuit 40' to approximately the same frequency as the undesired signal component $F_b$. The frequency steering circuit 100 includes a set of four operational amplifiers 102-108 and their associated resistors and capacitors for converting the differential balanced input OSV to a unipolar signal. The frequency steering circuit 100 also includes a pair of variable capacitance diodes 110 which are used to tune the voltage controlled oscillator circuit 40' in response to the OSV input signal. A pair of variable capacitance diodes 112 and 114 are also used for the fine tuning of the oscillator circuit 40' in response to the FC input signal. The output from the voltage controlled oscillator circuit 40' is then transmitted through a buffer amplifier circuit generally designated by reference numeral 116, a voltage limiter circuit 118 and a power amplifier circuit generally designated by the reference numeral 120. The final output signal from the voltage controlled oscillator module 62 is a signal "OO" which is transmitted to the quadrature hybrid 16' in the phase locked loop module 64 shown in FIG. 9.

Referring to FIG. 9, a circuit diagram of the phase locked loop module 64 is shown. The phase locked loop module 64 is provided with two input signals, namely the IUDA signal (containing $F_b$) from the power splitter 38', and the OO input signal from the voltage controlled oscillator module 62. The voltage controlled oscillator signal OO is transmitted to the quadrature hybrid 16' (ANZAC Part No. JH119). As described above, the quadrature hybrid 16' produces the $F_i$ and $F_q$ reference signals which are displaced 90° in phase.

The $F_i$ reference signal is transmitted to the power splitter 52 through an amplifier 122. The power splitter 52 is shown to be a three-way power splitter in FIG. 9, so that the power splitter 26' is not required. Similarly, the $F_q$ reference signal is transmitted to a three-way power splitter 54 through an amplifier 124. One of the outputs from each of the power splitters 52 and 54 is transmitted to the hybrid junction 56 (Merrimac HJF-A-200). One of the outputs from the hybrid junction 56 is directed to the phase detector 44', while the other output is transmitted to a lock indicator circuit 126 via conductor 58. The phase detector 44' (MCI double balanced mixer) also receives the signal IUDA which contains the $F_b$ signal component.

The output from the phase detector 44' is connected to the integrator circuit 46' which produces the frequency control signal FC. The integrator circuit 46' includes an operational amplifier 128, a pair of transistors 130–132 and their associated filter components. It should be noted that the integrator circuit 46' sets the band width for the phase locked loop circuit.

The lock indicator circuit 126 includes a phase detector 128, a comparator 130 and a light emitting diode 132. The phase detector 128 receives the output signal from the hybrid junction 56 and the IUDB signal from the switch module 68. The comparator 130 is provided with a small amount of bias to determine whether the output signal from the phase detector 128 is zero or not. A lock condition will be indicated when the output from the phase detector 128 is either positive or negative, and an out of lock condition will be indicated when this voltage is zero. Aside from the visual indication that the light emitting diode 132 can give for a lock condition, the lock indicator circuit 126 also provides for a line driver circuit 134 which can be used to transmit the lock indicator signal to another part of a system which includes a quadrature notch filter according to the present invention.

Figure 10:
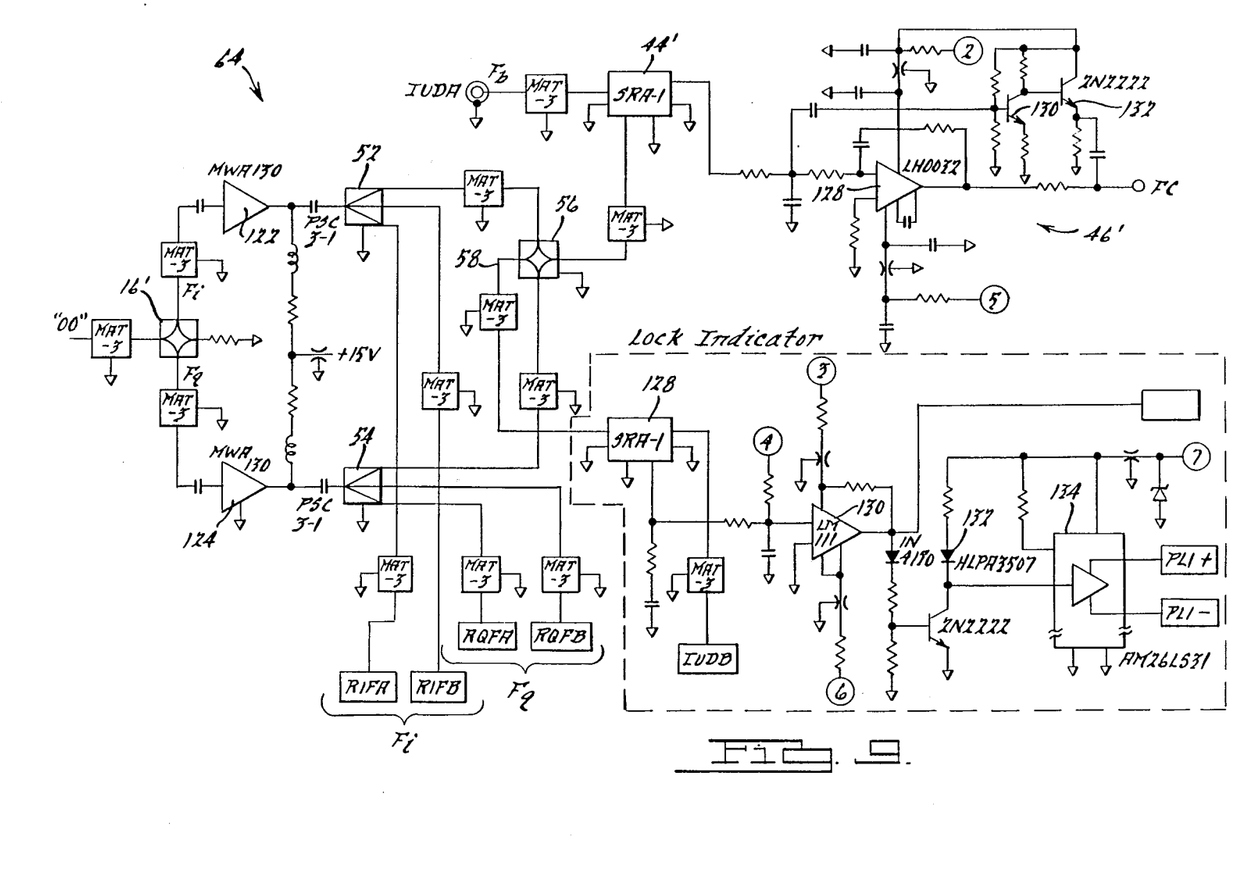
FIG. 10 is a circuit diagram of the quadrature rejector module shown in FIG. 6.
Figure 11:
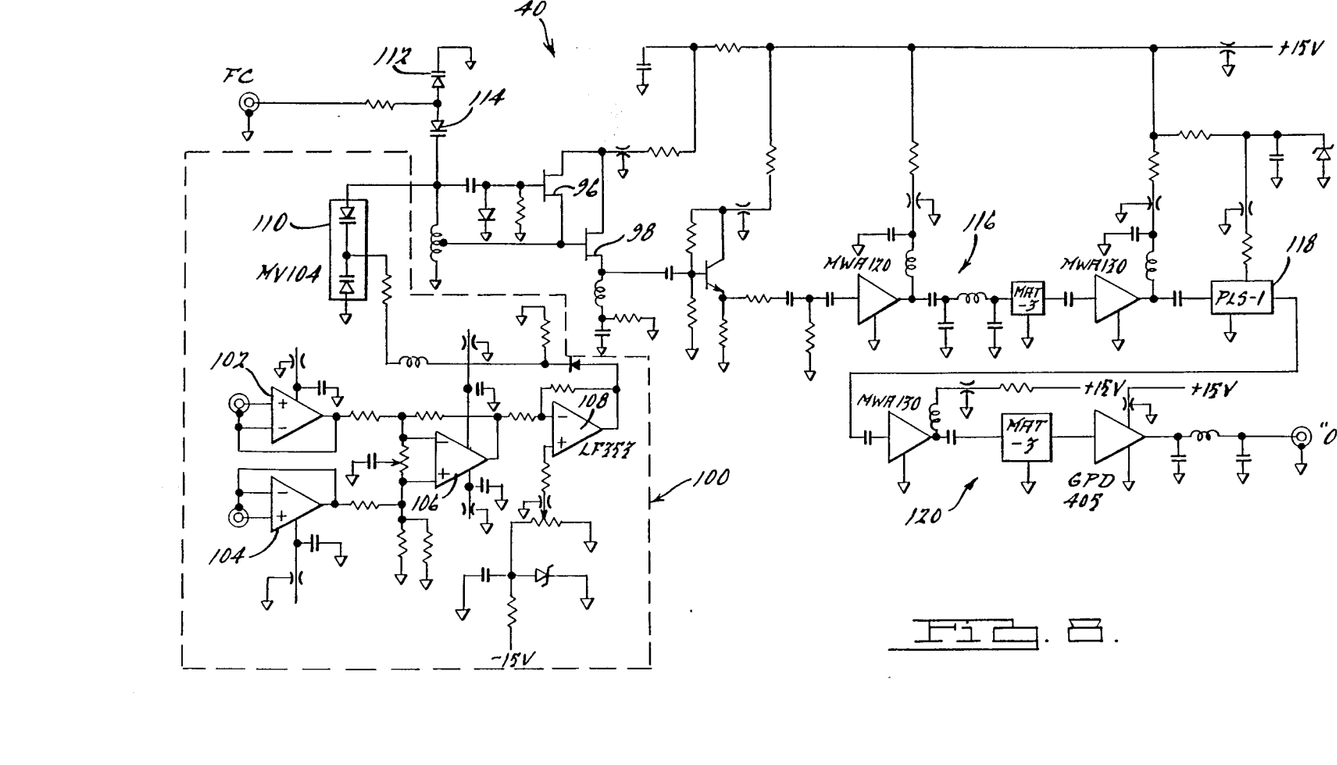

Referring to FIG. 10, a circuit diagram of the quadrature rejector module 66 is shown. The quadrature rejector module 66 receives the two $F_i$ reference signals RIFA-RIFB and the two $F_q$ reference signals ROFA-ROFB. The quadrature rejector module 66 also receives the ID input signal from the switch module 68. The power combiner 30' is shown in FIG. 10 to be comprised of two 180° hybrid vector adding combiners 136 and 138. The amplifier circuit 32' is also shown to be comprised of a series of three RF amplifier circuits 140–144.

Since the amplitude control loops 18' and 20' are essentially identical, only the top amplitude control loop 18' will be described herein. One of the outputs from the three-way power splitter 22' (PSC3-1) is connected to the synchronous demodulator circuit 24'. The synchronous demodulator circuit 24' is shown to be a phase detector (SRA-1) which is adapted to provide a zero phase difference output. The output from the synchronous demodulator circuit 24' is connected to the integrator circuit 27' which is shown to generally comprise an operational amplifier 146. The output from the integrator circuit 27' is connected to the multiplier circuit 28'. The multiplier circuit 28' is shown to be comprised of an in phase multiplier (P5-ATTL-400) which also receives the RIFA signal containing the $F_i$ reference signal. The output of the multiplier circuit 28' is then connected to the combiner circuit 136 to complete the loop. At the other end of the amplitude control loop 18', the power splitter 22' provides a filter output signal "FO" through a power amplifier 148.

The various embodiments which have been set forth above were for the purpose of illustration and were not intended to limit the invention. It will be appreciated by those skilled in the art that various changes and modifications may be made to these embodiments described in this specification without departing from the spirit and scope of the invention as defined by the appended claims.

I claim:

1. A method of rejecting an undesired frequency component of an input signal having an unknown phase, comprising the steps of:
   producing first and second reference signals having substantially the same frequency as said undesired frequency component but which are 90° out of phase with each other;
   maintaining an approximately 45° phase relationship between said undesired frequency component and one of said first and second reference signals; and
   adding said first and second reference signals to said input signal in amplitudes which will cancel said undesired frequency component.

2. The method according to claim 1, wherein said maintaining step includes the steps of comparing the phase of one of said reference signals to the phase of said undesired frequency component, generating a feedback signal which is related to the difference between these phases, and controlling the phase of said reference signals in response to said feedback signal in order to maintain said approximately 45° phase relationship between said undesired frequency component and one of said reference signals.

3. The method according to claim 2, of said reference signals are derived from a voltage controlled oscillator, and said feedback signal is used to control said voltage controlled oscillator.

4. The method according to claim 2, wherein said maintaining step also includes the steps of receiving said input signal, and locking on to said undesired signal component of said input signal.

5. The method according to claim 1, wherein said predetermined phase relationship is an approximately 45° phase relationship between said undesired signal component and one of said reference signals.

6. The method according to claim 1, further including the steps of detecting for the presence of a lock condition on said undesired frequency component, and providing a signal which is indicative of the presence of said lock condition.

7. A quadrature notch filter for rejecting an undesired frequency component of an input signal having an unknown phase, comprising:
   quadrature means producing first and second reference signals which have substantially the same frequency as said undesired frequency component but which are 90° out of phase with each other;
   amplitude control loop means for adding said first and second reference signals to said input signal in amplitudes which will cancel said undesired frequency component; and
   phase locked loop means for maintaining a predetermined phase relationship between said undesired frequency component and one of said first and second reference signals, said phase lock loop means including hybrid means for providing an approximately 45° phase relationship between said undesired frequency component and one of said reference signals.

8. The quadrature notch filter according to claim 7, wherein said phase lock loop means includes a voltage controlled oscillator whose output is connected to said quadrature means, phase detector means for comparing the phase of one of said reference signals to the phase of said undesired frequency component and generating a feedback signal which is related to the difference between these phases, and integrator means for controlling said voltage controlled oscillator in response to said feedback signal such that said approximately 45° phase relationship between said undesired frequency component and one of said reference signals is maintained.

9. The quadrature notch filter according to claim 8, wherein said phase lock loop means also includes hybrid means for providing an approximately 45° phase relationship between said undesired signal component and one of said reference signals.

10. The quadrature notch filter according to claim 8, wherein said undesired frequency is a backscatter signal.

11. A quadrature notch filter for rejecting an undesired frequency component of an input signal, comprising:
   an oscillator which generates an output signal that has substantially the same frequency as said undesired frequency component;
   a quadrature hybrid circuit which splits said output signal into first and second reference signals, said first and second reference signals being 90° out of phase with each other;
   an amplitude control loop circuit for each of said first and second reference signals which adds said first and second reference signals to said input signal in amplitudes which will cancel said undesired frequency component;
   a hybrid circuit which produces a third reference signal having a phase which is between the phases of said first and second reference signals;
   a phase detector circuit which compares the phase of said undesired frequency component with the phase of said third reference signal and produces a feedback signal that is related to the compared phase difference; and
   an integrator circuit which controls said oscillator such that said oscillator will maintain a predetermined phase relationship between said undesired frequency component and said third reference signal.

12. The quadrature notch filed according to claim 11, wherein each of said amplitude control loops include at least one multiplier circuit, and the phase of said third reference signal is selected to maximize the phase margin for said multipliers.

* * * * *